(12) United States Patent
Watanabe

(10) Patent No.: US 7,514,513 B2
(45) Date of Patent: Apr. 7, 2009

(54) POLYMER, FILM-FORMING COMPOSITION COMPRISING THE POLYMER, INSULATING FILM FORMED BY USING THE COMPOSITION AND ELECTRONIC DEVICE

(75) Inventor: Yasufumi Watanabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 160 days.

(21) Appl. No.: 11/502,519

(22) Filed: Aug. 11, 2006

(65) Prior Publication Data

US 2007/0037941 A1 Feb. 15, 2007

(30) Foreign Application Priority Data

Aug. 12, 2005 (JP) ............................ P2005-234495
Feb. 24, 2006 (JP) ............................ P2006-048813

(51) Int. Cl.
*C08F 38/00* (2006.01)
*C08F 4/34* (2006.01)
*C07C 13/615* (2006.01)

(52) U.S. Cl. .................... 526/282; 526/218.1; 526/227; 526/285; 585/22

(58) Field of Classification Search ................. 526/285, 526/282, 218.1, 227; 585/22, 352
See application file for complete search history.

(56) References Cited

U.S. PATENT DOCUMENTS

| 3,457,318 | A | * | 7/1969 | Capaldi et al. ............. 585/317 |
| 4,849,565 | A | | 7/1989 | Baum et al. |
| 5,017,734 | A | | 5/1991 | Baum et al. |
| 6,129,901 | A | | 10/2000 | Moskovits et al. |
| 6,203,771 | B1 | | 3/2001 | Lester et al. |
| 2004/0127715 | A1 | * | 7/2004 | Kunimi et al. ............. 546/285 |
| 2005/0276743 | A1 | | 12/2005 | Lacombe et al. |

FOREIGN PATENT DOCUMENTS

| DE | 197 34 973 A1 | 2/1999 |
| EP | 0 281 364 A2 | 9/1988 |
| EP | 0 951 047 A2 | 10/1999 |
| GB | 2 131 713 A | 6/1984 |
| JP | 2003-268592 A | 9/2003 |
| JP | 2003-292878 A | 10/2003 |
| WO | WO 02/066370 A2 | 8/2002 |

OTHER PUBLICATIONS

European Search Report dated Jul. 23, 2007.
XP-002408331—A. A. Malik et al., "Thermally Stable Polymers Based on Acetylene-Terminated Adamantanes" (1992) Journal of Polymer Science, vol. 3, No. 8, pp. 1747-1754.

* cited by examiner

*Primary Examiner*—Fred M Teskin
(74) *Attorney, Agent, or Firm*—Sughrue Mion, PLLC

(57) ABSTRACT

A polymer obtained by polymerizing a compound represented by formula (I) in a presence of a polymerization accelerator; a film-forming composition comprising the polymer; an insulating film formed by utilizing the composition; and an electronic device,

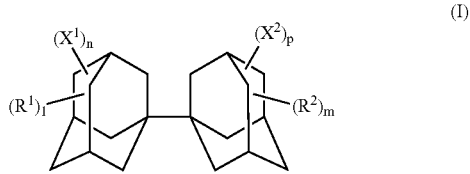

(I)

in formula (I), $R^1$ and $R^2$ each independently represents a substituent containing a carbon-carbon triple bond; $X^1$ and $X^2$ each independently represents a substituent except for a substituent containing a carbon-carbon triple bond; l and m each independently represents an integer of 0 to 15, provided that l and m are not 0 at the same time; and p and n each independently represents an integer of 0 to 14.

6 Claims, 2 Drawing Sheets

POLYMER, FILM-FORMING COMPOSITION COMPRISING THE POLYMER, INSULATING FILM FORMED BY USING THE COMPOSITION AND ELECTRONIC DEVICE

BACKGROUND OF THE INVENTION

1. Field of the Invention

The present invention relates to a film-forming composition. More specifically, the present invention relates to an insulating film having good film properties such as dielectric constant and mechanical strength for use in an electronic device and the like.

2. Description of the Related Art

In the field of electronic materials, with recent progress of high integration, multifunction and high performance, the circuit resistance and the capacity of a capacitor between wirings are increased and this leads to increase in the electric power consumption and delay time. Particularly, increase in the delay time becomes a large factor for the reduction in the signal speed of a device and the generation of crosstalk and therefore, reduction in the parasitic resistance or parasitic capacity is required so as to provide a high-speed device by reducing this delay time. For reducing the parasitic capacity, one specific countermeasure attempted is to cover the periphery of wiring with a low dielectric interlayer insulating film. The interlayer insulating film is required to have excellent heat resistance enough to withstand the thin film formation step at the production of a mounting substrate or the post step such as chip connection and pin attachment and also have chemical resistance enough to withstand a wet process. Furthermore, the wiring is recently shifting from Al wiring to low-resistance Cu wiring and along with this trend, flattening by CMP (chemical mechanical polishing) becomes a common practice. Thus, mechanical strength sufficiently high to withstand this process is demanded.

As for the insulating film with high heat resistance, polybenzoxazole and polyimide are widely known. However, since these contain an N atom having high polarity, an insulating film satisfied in view of low dielectricity, low water absorption, durability and hydrolysis resistance is not yet obtained.

Furthermore, most of organic polymers in general exhibit insufficient solubility in an organic solvent and how to prevent the precipitation in the coating solution or the generation of particles in the insulating film is an important problem to be solved. When the polymer main chain is modified to have a folded structure so as to increase the solubility, this disadvantageously causes reduction in the glass transition point and the heat resistance and it is not easy to satisfy both of these properties at the same time.

Also, a highly heat-resistant resin having a polyarylene ether as the basic main chain is known and the relative dielectric constant thereof is from 2.6 to 2.7. However, in order to realize a high-speed device, more reduction in the dielectric constant is demanded, and the relative dielectric constant as a bulk without porosification is preferably reduced to 2.6 or less, more preferably 2.5 or less.

An insulating film using a thermal polymer of an ethynyl group-substituted adamantane is disclosed in JP-A-2003-292878 (the term "JP-A" as used herein means an "unexamined published Japanese patent application"). However, since this monomer is polymerized without using a polymerization catalyst, the reaction takes a long time and this causes a problem, for example, an undesired side reaction such as air oxidation proceeds, as a result, the relative dielectric constant of the obtained insulating film becomes high or a polymer sparingly soluble in a coating solvent is produced in a large amount as a by-product to worsen the surface state.

Furthermore, a polymer capable of thin film formation using an biadamantane monomer having a carbon-carbon triple bond as a polymerizable group is not known, and a case succeeded in forming a low dielectric thin film from this polymer is also not known.

SUMMARY OF THE INVENTION

The present invention relates to a polymer for solving those problems and also relates to a film-forming composition. More specifically, the present invention provides a film-forming composition being uniform without precipitation of an insoluble matter and capable of forming a coat with good surface state, and further provides a film-forming composition ensuring that an insulating film for use in an electronic device or the like can be formed with good surface state while satisfying the properties such as dielectric constant and mechanical strength. The present invention also provides an insulating film (an "insulating film" is also referred to as a "dielectric film" or a "dielectric insulating film", and these terms are not substantially distinguished.) formed from the composition and an electronic device having the insulating film.

These objects can be attained by the following constitutions.

(1) A polymer obtained by polymerizing a compound represented by formula (I) in a presence of a polymerization accelerator:

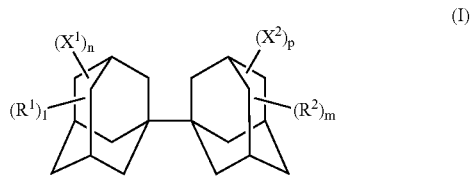

wherein $R^1$ and $R^2$ each independently represents a substituent containing a carbon-carbon triple bond;

$X^1$ and $X^2$ each independently represents a substituent except for a substituent containing a carbon-carbon triple bond;

l and m each independently represents an integer of 0 to 15, provided that l and m are not 0 at the same time; and p and n each independently represents an integer of 0 to 14.

(2) The polymer as described in (1) above,
wherein the polymerization accelerator is a transition metal catalyst.

(3) The polymer as described in (2) above,
wherein the transition metal catalyst is a palladium catalyst.

(4) The polymer as described in (1) above,
wherein the polymerization accelerator is a radical polymerization initiator.

(5) The polymer as described in (4) above,
wherein the radical polymerization initiator is selected from the group consisting of an organic peroxide and an azo compound.

(6) The polymer as described in any of (1) to (5) above, which can be dissolved in cyclohexanone to a concentration of 1 mass % or more at 25° C.

(7) The polymer as described in any of (1) to (6) above, wherein an amount of the polymerization accelerator utilized is from 0.001 to 2 mol per mol of a monomer of the compound represented by formula (I).

(8) A film-forming composition comprising a polymer as described in any of (1) to (7) above.

(9) A film-forming composition comprising a polymer of a compound represented by formula (I):

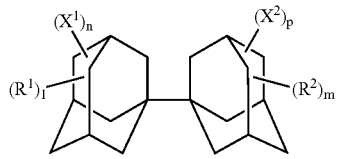

(I)

wherein R¹ and R² each independently represents a substituent containing a carbon-carbon triple bond;

X¹ and X² each independently represents a substituent except for a substituent containing a carbon-carbon triple bond;

l and m each independently represents an integer of 0 to 15, provided that l and m are not 0 at the same time; and p and n each independently represents an integer of 0 to 14.

(10) The film-forming composition as described in (8) or (9) above, which further comprises a coating solvent.

(11) The film-forming composition as described in any of (8) to (10) above, which further comprises a pore-forming agent.

(12) The film-forming composition as described in any of (8) to (11) above, which further comprises an adhesion accelerator.

(13) An insulating film formed by utilizing a film-forming composition as described in any of (8) to (12) above.

(14) An electronic device comprising an insulating film as described in (13) above.

(15) A process for producing a polymer, the process comprising:

polymerizing a compound represented by formula (I) in a presence of a polymerization accelerator:

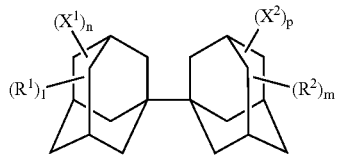

(I)

wherein R¹ and R² each independently represents a substituent containing a carbon-carbon triple bond;

X¹ and X² each independently represents a substituent except for a substituent containing a carbon-carbon triple bond;

l and m each independently represents an integer of 0 to 15, provided that l and m are not 0 at the same time; and p and n each independently represents an integer of 0 to 14.

DETAILED DESCRIPTION OF THE INVENTION

Figure 1:
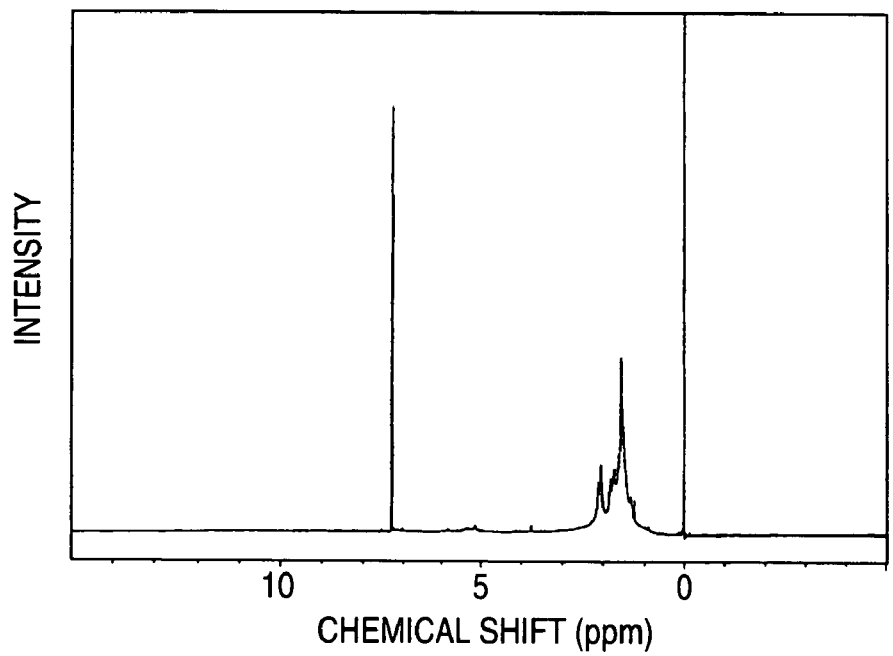
FIG. 1 is a ¹H-NMR chart of Polymer (B) synthesized in Example 3.

The present invention is described in detail below.

The polymer of the present invention is obtained by polymerizing a compound represented by formula (I) in the presence of a polymerization accelerator, and the film-forming composition of the present invention comprises a polymer of a compound represented by formula (I).

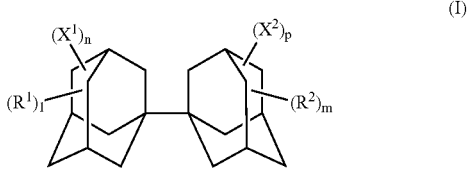

(I)

wherein

R¹ and R² each independently represents a substituent containing a carbon-carbon triple bond, X¹ and X² each independently represents a substituent except for a substituent containing a carbon-carbon triple bond, l and m each independently represents an integer of 0 to 15, provided that l and m are not 0 at the same time, and p and n each independently represents an integer of 0 to 14.

The compound represented by formula (I) has at least one carbon-carbon triple bond-containing group as R¹ or R² which is a substituent to the adamantane skeleton.

The carbon-carbon triple bond-containing substituent preferred as R¹ or R² includes an alkynyl group (preferably an alkynyl group having a total carbon number of 2 to 10), an alkyl group having a carbon-carbon triple bond in the chain (preferably an alkyl group having a total carbon number of 3 to 10), and an aryl group having a carbon-carbon triple bond-containing group as a substituent (preferably an aryl group having a total carbon number of 8 to 30).

The substituent as R¹ or R² is preferably an alkynyl group or an aryl group having a carbon-carbon triple bond as a substituent, more preferably an alkynyl group, still more preferably an ethynyl group.

The carbon-carbon triple bond-containing group may further has another substituent, and examples of the another substituent include a halogen atom (fluorine, chlorine, bromine or iodine), a linear, branched or cyclic alkyl group (e.g., methyl, tert-butyl, cyclopentyl, cyclohexyl, adamantyl, biadamantyl, diadamantyl), an alkynyl group (e.g., ethynyl, phenylethynyl), an aryl group (e.g., phenyl, 1-naphthyl, 2-naphthyl), an acyl group (e.g., benzoyl), an aryloxy group (e.g., phenoxy), an arylsulfonyl group (e.g., phenylsulfonyl), a nitro group, a cyano group, a silyl group (e.g., triethoxysilyl, methyldiethoxysilyl, trivinylsilyl), an alkoxycarbonyl group and a carbamoyl group. These substituents each may be further substituted by another substituent.

The adamantane skeleton in formula (I) may have, as X, a substituent except for a carbon-carbon triple bond-containing group, and examples thereof include a halogen atom (fluorine, chlorine, bromine or iodine), an alkyl group (e.g., methyl, tert-butyl, cyclopentyl, cyclohexyl, adamantyl, biadamantyl, diadamantyl), an acyl group (e.g., benzoyl), an aryloxy group (e.g., phenoxy), an arylsulfonyl group (e.g., phenylsulfonyl), a nitro group, a cyano group and a silyl group (e.g., triethoxysilyl, methyldiethoxy-silyl, trivinylsilyl). Among these, an alkyl group is preferred, and a methyl group is more preferred.

The number (l or m) of the carbon-carbon triple bond-containing groups substituted per one adamantane skeleton is preferably from 0 to 4, more preferably from 0 to 2, still more preferably 0 or 1. Also, l+m is an integer of 1 or more, preferably from 1 to 4, more preferably from 1 to 3, still more preferably 2.

The number (n or p) of the substituents except for the carbon-carbon triple bond-containing group, substituted per one adamantane skeleton is preferably from 0 to 4, more preferably from 0 to 2, still more preferably 0.

The molecular weight of the compound represented by formula (I) is preferably from 290 to 7,000, more preferably from 290 to 600, still more preferably from 290 to 400.

At the time of obtaining a polymer by polymerizing the compound represented by formula (I), one compound represented by formula (I) may be used alone, or two or more thereof may be used as a mixture.

Specific examples of the compound represented by formula (I) are set forth below, but the present invention is not limited thereto.

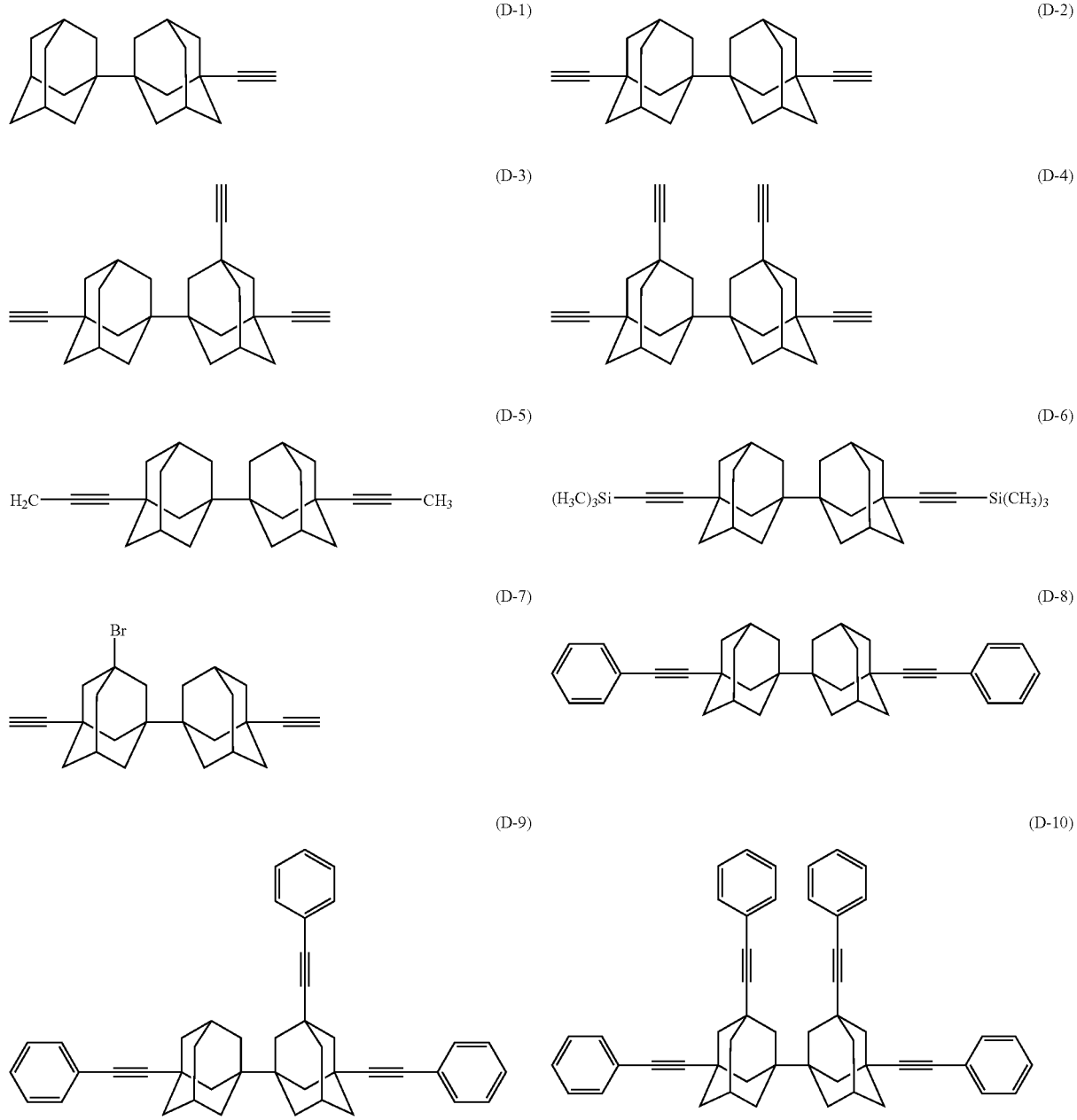

-continued
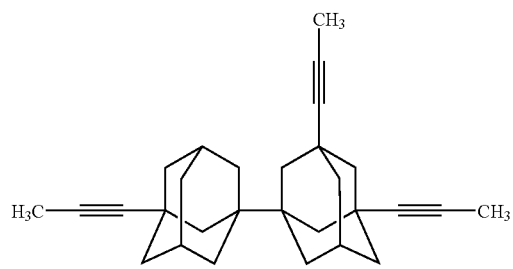
(D-11)
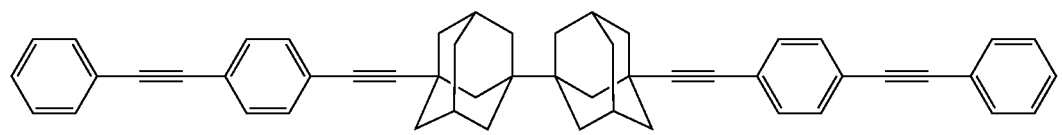
(D-12)
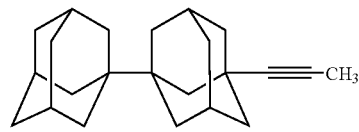
(D-13)
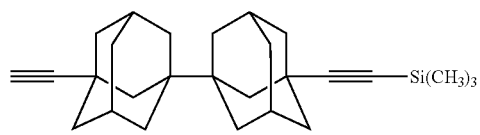
(D-14)
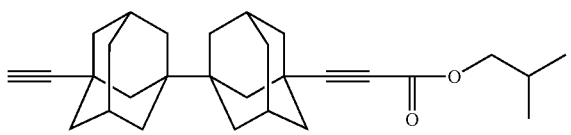
(D-15)
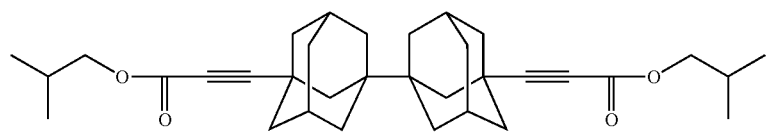
(D-16)
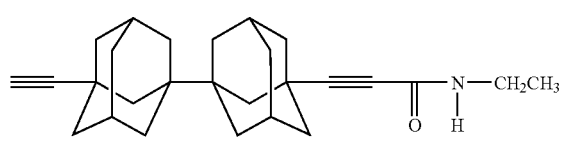
(D-17)
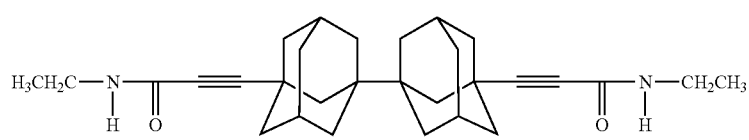
(D-18)
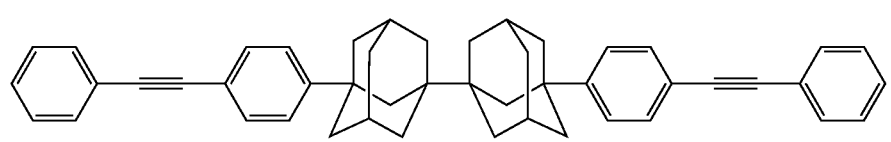
(D-19)
(D-20)

-continued
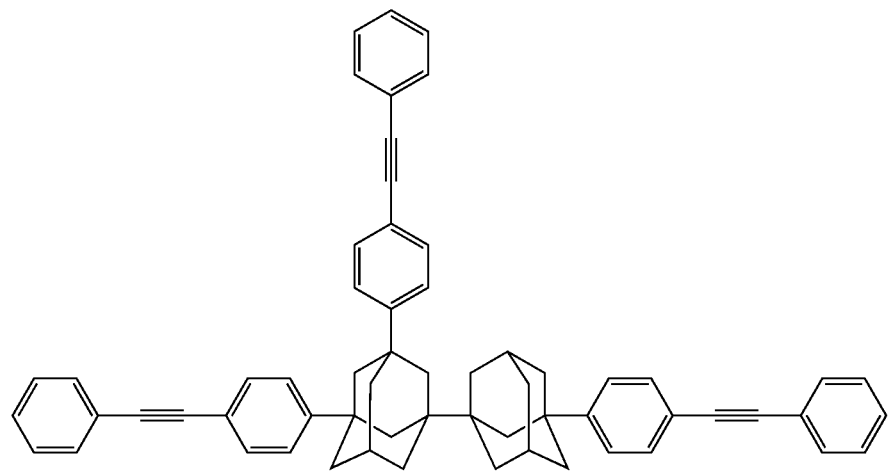
(D-21)
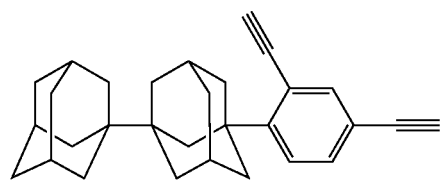
(D-22)
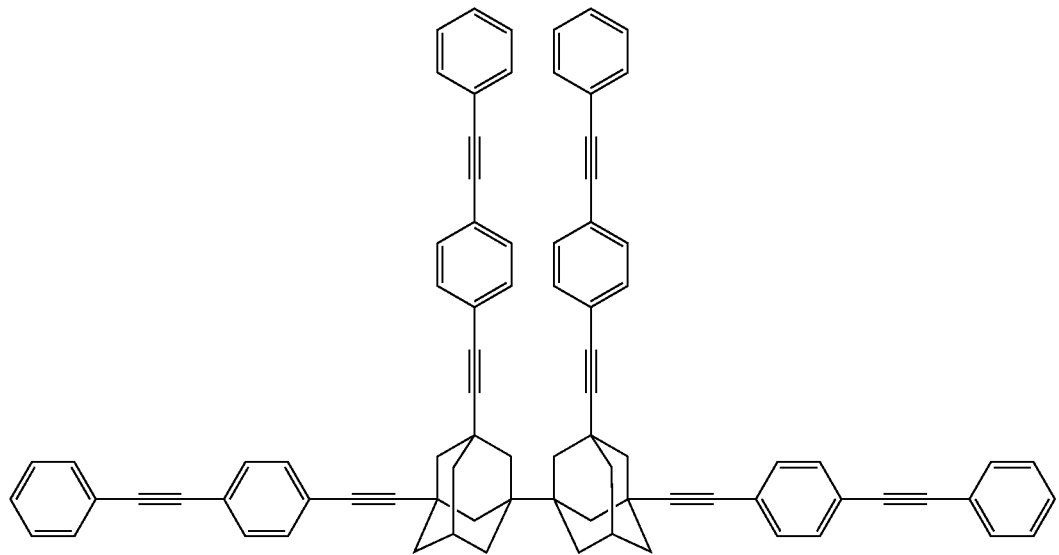
(D-23)

-continued

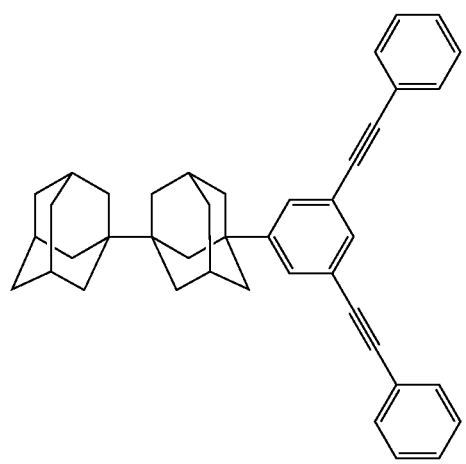
(D-24)

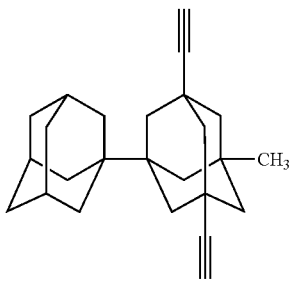
(D-25)

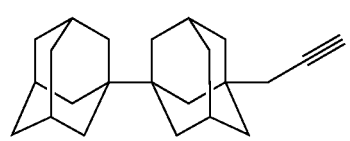
(D-26)

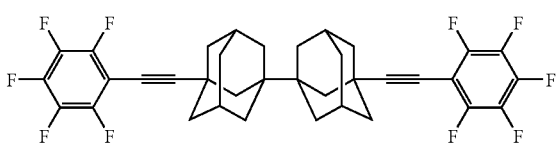
(D-27)

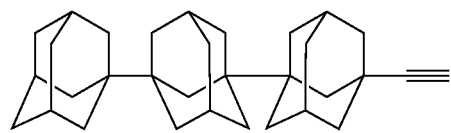
(D-28)

(D-29)

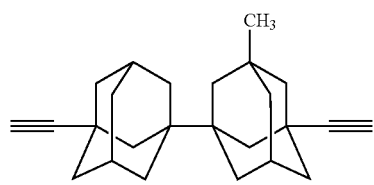
(D-30)

(D-31)

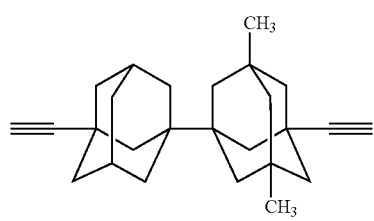
(D-31)

(D-32)

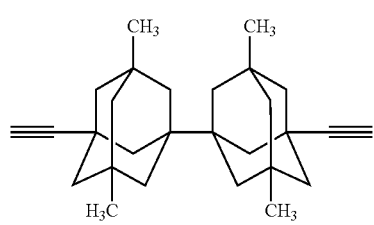
(D-33)

In order to introduce an ethynyl group in the synthesis of the compound represented by formula (I), this can be easily achieved, for example, by using a commercially available bromine-substituted biadamantane as a raw material, subjecting it to a Friedel-Crafts reaction with vinyl bromide in the presence of a Lewis acid such as aluminum bromide, aluminum chloride or iron chloride to introduce a 2,2-dibromoethyl group, and then treating the reaction product with a strong base for HBr removal. An aryl group can also be easily introduced by a Friedel-Crafts reaction of a bromine-substituted biadamantane with an aryl derivative.

The polymerization of the compound represented by formula (I) is preferably performed in a solvent.

The solvent used in the polymerization reaction of the compound represented by formula (I) may be any solvent as long as it can dissolve the raw material monomer at a required concentration and does not adversely affect the properties of the film formed from the obtained polymer. Examples of the solvent which can be used include water; an alcohol-based solvent such as methanol, ethanol and propanol; a ketone-based solvent such as alcohol-acetone, methyl ethyl ketone, methyl isobutyl ketone, cyclohexanone and acetophenone; an ester-based solvent such as ethyl acetate, butyl acetate, propylene glycol monomethyl ether acetate, γ-butyrolactone and methyl benzoate; an ether-based solvent such as dibutyl ether and anisole; an aromatic hydrocarbon-based solvent such as toluene, xylene, mesitylene, 1,2,4,5-tetramethylbenzene, pentamethylbenzene, isopropylbenzene, 1,4-diisopropylbenzene, tert-butylbenzene, 1,4-di-tert-butylbenzene, 1,3,5-triethylbenzene, 1,3,5-tri-tert-butylbenzene, 4-tert-butyl-orthoxylene, 1-methyl-naphthalene and 1,3,5-triisopropylbenzene; an amide-based solvent such as N-methylpyrrolidinone and dimethyl-acetamide; a halogen-based solvent such as carbon tetrachloride, dichloromethane, chloroform, 1,2-dichloro-ethane, chlorobenzene, 1,2-dichlorobenzene and 1,2,4-trichlorobenzene; and an aliphatic hydrocarbon-based solvent such as hexane, heptane, octane and cyclohexane.

Among these solvents, preferred are acetone, methyl ethyl ketone, methyl isobutyl ketone, cyclohexanone, acetophenone, ethyl acetate, propylene glycol monomethyl ether acetate, γ-butyrolactone, anisole, tetrahydrofuran, toluene, xylene, mesitylene, 1,2,4,5-tetramethylbenzene, isopropylbenzene, tert-butylbenzene, 1,4-di-tert-butylbenzene, 1,3,5-tri-tert-butylbenzene, 4-tert-butyl-orthoxylene, 1-methyl-naphthalene, 1,3,5-triisopropylbenzene, 1,2-dichloroethane, chlorobenzene, 1,2-dichlorobenzene and 1,2,4-trichlorobenzene, more preferred are tetrahydrofuran, γ-butyrolactone, anisole, toluene, xylene, mesitylene, isopropylbenzene, tert-butylbenzene, 1,3,5-tri-tert-butyl-benzene, 1-methylnaphthalene, 1,3,5-triisopropylbenzene, 1,2-dichloroethane, chlorobenzene, 1,2-dichlorobenzene and 1,2,4-trichlorobenzene, and still more preferred are γ-butyrolactone, anisole, mesitylene, tert-butylbenzene, 1,3,5-triisopropylbenzene, 1,2-dichlorobenzene and 1,2,4-trichlorobenzene. One of these solvents may be used alone, or two or more thereof may be used as a mixture.

The boiling point of the organic solvent for the reaction is preferably 50° C. or more, more preferably 100° C. or more, still more preferably 150° C. or more.

The concentration of the reaction solution is preferably from 1 to 50 mass %, more preferably from 5 to 30 mass %, still more preferably from 10 to 20 mass %. (In this specification, mass ratio is equal to weight ratio.)

The polymerization of the compound represented by formula (I) of the present invention is preferably performed by an addition-polymerization reaction of a carbon-carbon triple bond. In the present invention, as for the addition-polymerization reaction, for example, cationic polymerization, anionic polymerization, radical polymerization and thermal polymerization, which are known in the field of organic synthesis, may be utilized.

In the present invention, the polymerization reaction of the compound represented by formula (I) is preferably performed in the presence of a polymerization accelerator. Examples of the polymerization accelerator include a metal catalyst and a radical polymerization initiator.

Use of a metal catalyst advantageously brings about reduction in the reaction time and the reaction temperature and additionally provides an excellent effect that a polymer having good solubility in a coating solvent can be obtained at a high yield. The catalyst which can be used is preferably a transition metal catalyst, and preferred examples thereof include a palladium catalyst such as $Pd(PPh_3)_4$, bis(benzonitrile)palladium chloride and $Pd(OAc)_2$; a Ziegler-Natta catalyst; an Ni-based catalyst such as nickel acetylacetonate; a W-based catalyst such as $WCl_6$; an Mo-based catalyst such as $MoCl_5$; a Ta-based catalyst such as $TaCl_5$; an Nb-based catalyst such as $NbCl_5$; an Rh-based catalyst; and a Pt-based catalyst.

The polymerization reaction of the compound represented by formula (I) (hereinafter sometimes referred to as "the monomer of the present invention") is more preferably performed in the presence of a radical polymerization initiator. For example, a monomer having a polymerizable carbon-carbon triple bond may be polymerized in the presence of a polymerization initiator capable of exhibiting activity by generating a free radical such as carbon radical or oxygen radical upon heating.

As for the radical polymerization initiator, an organic peroxide and an organic azo-based compound are preferred, and an organic peroxide is more preferred.

Preferred examples of the organic peroxide include those commercially available from NOF Corp., such as ketone peroxides (e.g., PERHEXA H), peroxy ketals (e.g., PERHEXA TMH), hydroperoxides (e.g., PERBUTYL H-69), dialkyl peroxides (e.g., PERCUMYL D, PERBUTYL C, PERBUTYL D), diacyl peroxides (e.g., NYPER BW), peroxy esters (e.g., PERBUTYL Z, PERBUTYL L) and peroxy dicarbonates (e.g., PEROYL TCP); diisobutyryl peroxide, cumyl peroxy-neodecanoate, di-n-propyl peroxydicarbonate, diisopropyl peroxydicarbonate, di-sec-butyl peroxydicarbonate, 1,1,3,3-tetramethylbutyl peroxyneodecanoate, di(4-tert-butylchlorohexyl) peroxydicarbonate, di(2-ethylhexyl) peroxydicarbonate, tert-hexyl peroxyneodecanoate, tert-butyl peroxyneodecanoate, tert-butyl peroxyneoheptanoate, tert-hexyl peroxypivalate, tert-butyl peroxypivalate, di(3,5,5-trimethylhexanoyl) peroxide, dilauroyl peroxide, 1,1,3,3-tetramethylbutyl peroxy-2-ethylhexanoate, disuccinic peroxide, 2,5-dimethyl-2,5-di(2-ethylhexanoyl-peroxy)hexane, tert-hexyl peroxy-2-ethylhexanoate, di(4-methylbenzoyl) peroxide, tert-butyl peroxy-2-ethylhexanoate, di(3-methylbenzoyl) peroxide, benzoyl(3-methylbenzoyl) peroxide, dibenzoyl peroxide, dibenzoyl peroxide, 1,1-di(tert-butylperoxy)-2-methylcyclohexane, 1,1-di(tert-hexylperoxy)-3,3,5-trimethylcyclohexane, 1,1-di(tert-hexylperoxy)cyclohexane, 1,1-di(tert-butylperoxy)cyclo-hexane, 2,2-di(4,4-di-(tert-butylperoxy)cyclohexyl)propane, tert-hexyl peroxyisopropyl-monocarbonate, tert-butyl peroxymaleate, tert-butyl peroxy-3,5,5-trimethylhexanoate, tert-butyl peroxylaurate, tert-butyl peroxyisopropyl-monocarbonate, tert-butyl peroxy-2-ethylhexylmonocarbonate, tert-hexyl peroxybenzoate, 2,5-dimethyl-2,5-di(benzoyl-peroxy)hexane, tert-butyl peroxyacetate, 2,2-di(tert-butylperoxy)butane, tert-butyl peroxybenzoate, n-butyl 4,4-di-tert-butyl peroxyvalerate, di(2-tert-butylperoxy-isopropyl)benzene, dicumyl peroxide, di-tert-hexyl peroxide, 2,5-dimethyl-2,5-di(tert-butylperoxy) hexane, tert-butylcumyl peroxide, di-tert-butyl peroxide, p-menthane hydroperoxide, 2,5-dimethyl-2,5-di(tert-butylperoxy)hexyne-3, diisopropylbenzene hydroperoxide, 1,1,3,3-tetramethylbutyl hydroperoxide, cumene hydroperoxide, tert-butyl hydroperoxide, 2,3-dimethyl-2,3-diphenylbutane, 2,4-dichlorobenzoyl peroxide, o-chlorobenzoyl peroxide, p-chlorobenzoyl peroxide, tris(tert-butylperoxy)triazine, 2,4,4-trimethylpentyl peroxyneodecanoate, α-cumyl peroxyneodecanoate, tert-amyl peroxy-2-ethylhexanoate, tert-butyl peroxyisobutyrate, di-tert-butyl peroxyhexahydro-terephthalate, di-tert-butyl peroxytrimethyladipate, di-3-methoxybutyl peroxydicarbonate, diisopropyl peroxy-dicarbonate, tert-butyl peroxyisopropylcarbonate, 1,6-bis(tertbutylperoxycarbonyloxy)hexane, diethylene glycol bis(tert-butylperoxycarbonate) and tert-hexyl peroxy-neodecanoate.

Preferred examples of the organic azo-based compound include those commercially available from Wako Pure Chemical Industries, Ltd., such as azonitrile compounds (e.g., V-30, V-40, V-59, V-60, V-65, V-70), azoamide compounds (e.g., VA-080, VA-085, VA-086, VF-096, VAm-110, VAm-111), cyclic azoamidine compounds (e.g., VA-044, VA-061) and azoamidine compounds (e.g., V-50, VA-057); 2,2-azobis(4-methoxy-2,4-dimethylvaleronitrile), 2,2-azo-bis-(2,4-dimethylvaleronitrile), 2,2-azobis(2-methylpropionitrile), 2,2-azobis(2,4-dimethylbutyronitrile), 1,1-azobis (cyclohexane-1-carbonitrile), 1-[(1-cyano-1-methylethyl)azo]formamide, 2,2-azobis{2-methyl-N-[1,1-bis(hydroxymethyl)-2-hydroxyethyl]propionamide}, 2,2-azobis[2-methyl-N-(2-hydroxybutyl)propionamide], 2,2-azobis[N-(2-propenyl)-2-methylpropionamide], 2,2-azobis (N-butyl-2-methylpropionamide), 2,2-azobis(N-cyclohexyl-2-methylpropionamide), 2,2-azobis[2-(2-imidazolin-2-yl)-propane]dihydrochloride, 2,2-azobis[2-(2-imidazolin-2-yl)-propane]disulfate dihydrate, 2,2-azobis[2-[1-(2-hydroxyethyl)-2-imidazolin-2-yl]propane]dihydrochloride, 2,2-azobis[2-[2-imidazolin-2-yl]propane], 2,2-azobis(1-imino-1-pyrrolidino-2-methylpropane)dihydrochloride, 2,2-azobis (2-methylpropionamidine)dihydrochloride, 2,2-azobis[N-(2-carboxyethyl)-2-methylpropionamidine]tetrahydrate, dimethyl 2,2-azobis(2-methylpropionate), 4,4-azobis(4-cyanovaleric acid) and 2,2-azobis(2,4,4-trimethylpentane).

One of these radical polymerization initiators for use in the present invention may be used alone, or two or more thereof may be used as a mixture.

The amount used of the polymerization accelerator such as metal catalyst and radical polymerization initiator is preferably from 0.001 to 2 mol, more preferably from 0.01 to 1 mol, still more preferably from 0.05 to 0.5 mol, per mol of the monomer.

Among these, an organic peroxide and an organic azo-based compound are preferred, and an organic peroxide-based radical initiator is more preferred, because a soluble polymer having high solubility in a coating solvent such as cyclohexanone can be obtained at a high yield.

In the present invention, the optimal conditions for the addition-polymerization reaction vary depending on the kind of catalyst or solvent, the amount or concentration of catalyst, or the like, but the inner temperature is preferably from 0 to 230° C., more preferably from 100 to 230° C., still more preferably from 180 to 230° C., and the reaction time is preferably from 1 to 50 hours, more preferably from 2 to 20 hours, still more preferably from 3 to 10 hours.

For preventing oxidative decomposition of the polymer, it is also preferred to perform the reaction in an inert gas atmosphere (e.g., nitrogen, argon). The polymerization may be also preferably performed under a light-shielded condition for suppressing an undesired photoreaction.

The weight (mass) average molecular weight of the polymer obtained by the polymerization is preferably from 1,000 to 500,000, more preferably from 3,000 to 300,000, still more preferably from 5,000 to 200,000.

When a coating solvent is contained together with the compound represented by formula (I), a film-forming composition preferred as a coating solution may be obtained.

The polymerization product of the compound represented by formula (I) is preferably dissolved in a coating solvent at a sufficiently high concentration. As for the solubility, the polymerization product is, as a guide, preferably dissolved at 25° C. to a concentration of 1 mass % or more, more preferably 7 mass % or more, still more preferably 10 mass % or more, in a coating solvent (for example, cyclohexanone) used at the production of an electronic device.

Such a polymerization product can be prepared by selecting a radical initiator as described above.

Preferred examples of the coating solvent include an alcohol-based solvent such as methanol, ethanol, isopropanol, 1-butanol, 2-ethoxymethanol and 3-methoxy-propanol; a ketone-based solvent such as acetone, acetylacetone, methyl ethyl ketone, methyl isobutyl ketone, 2-pentanone, 3-pentanone, 2-heptanone, 3-heptanone and cyclohexanone; an ester-based solvent such as ethyl acetate, propyl acetate, butyl acetate, isobutyl acetate, pentyl acetate, ethyl propionate, propyl propionate, butyl propionate, isobutyl propionate, propylene glycol monomethyl ether acetate, methyl lactate, ethyl lactate and γ-butyrolactone; an ether-based solvent such as diisopropyl ether, dibutyl ether, ethyl propyl ether, anisole, phenetole and veratrole; an aromatic hydrocarbon-based solvent such as mesitylene, ethylbenzene, diethylbenzene, propylbenzene and 1,2-dichlorobenzene; and an amide-based solvent such as N-methylpyrrolidinone and dimethylacetamide. One of these solvents may be used alone, or two or more thereof may be used as a mixture.

Among these solvents, more preferred are acetone, propanol, cyclohexanone, propylene glycol monomethyl ether acetate, methyl lactate, ethyl lactate, γ-butyrolactone, anisole, mesitylene and 1,2-dichlorobenzene, and still more preferred are cyclohexanone, propylene glycol monomethyl ether acetate, γ-butyrolactone and anisole.

The total solid content concentration in the film-forming composition is preferably from 1 to 50 mass %, more preferably from 2 to 20 mass %, still more preferably from 3 to 10 mass %.

As for the polymer of the present invention, one polymer may be used alone, or two or more polymers may be used as a mixture.

The film-forming composition of the present invention may further contain additives such as radical generator, non-ionic surfactant, fluorine-containing ionic surfactant, silane-coupling agent and adhesion accelerator, within the range of not impairing the properties (e.g., heat resistance, dielectric constant, mechanical strength, coatability, adhesion) of the insulating film obtained.

Examples of the nonionic surfactant include octyl-polyethylene oxide, decylpolyethylene oxide, dodecylpoly-ethylene oxide, octylpolypropylene oxide, decylpoly-propylene oxide and dodecylpolypropylene oxide. Examples of the fluorine-containing nonionic surfactant include perfluorooctylpolyethylene oxide, perfluorodecylpoly-ethylene oxide and per-fluorododecylpolyethylene oxide. Examples of the silane-coupling agent include vinyl-trimethoxysilane, vinyltriethoxysilane, vinyltriacetoxy-silane, allyltrimethoxysilane, allyltriethoxysilane, divinyldiethoxysilane and trivinylethoxysilane.

As for the amount of such an additive added, the suitable range varies depending on the use of the additive or the solid content concentration of the coating solution, but the amount added is generally, in terms of mass % in the coating solution, preferably from 0.001 to 10%, more preferably from 0.01 to 5%, still more preferably from 0.05 to 2%.

The film-forming composition of the present invention preferably contains a pore-forming agent. The pore-forming agent is a substance having a function of forming pores in the film obtained from the film-forming composition. For example, when the film formed from the film-forming composition containing a pore-forming agent is heated, pores are formed in the film by the function of the pore-forming agent and a film comprising pores can be obtained.

The pore-forming agent is not particularly limited, but a thermally decomposable polymer capable of decomposing under heating may be used. The polymer as the pore-forming agent is preferably a polymer capable of thermally decomposing at a temperature lower than the thermal decomposition temperature of the polymer constituting the film.

Examples of the thermally decomposable polymer which can be used as the pore-forming agent include a polyvinyl aromatic compound (e.g., polystyrene, polyvinylpyridine, halogenated polyvinyl aromatic compound), a polyacrylonitrile, a polyalkylene oxide (e.g., polyethylene oxide, polypropylene oxide), a polyethylene, a polylactic acid, a polysiloxane, a polycaprolactone, a polycaprolactam, a polyurethane, a polymethacrylate (e.g., polymethyl meth-acrylate), a polymethacrylic acid, a polyacrylate (e.g., polymethyl acrylate), a polyacrylic acid, a polydiene (e.g., polybutadiene, polyisoprene), polyvinyl chloride, poly-acetal, and an amine-capped alkylene oxide (commercially available under the trade name of Jeffamine™ Polyether-amine from Huntsman Corp.).

The polymer as the pore-forming agent may be a homopolymer, a block copolymer, a random copolymer or a mixture thereof. Also, the polymer may be linear, branched, ultra-branched, dendritic or starlike.

In particular, a polystyrene is preferably used as the pore-forming agent. Examples thereof include an anionic-polymerized polystyrene, a syndiotactic polystyrene, and an unsubstituted or substituted polystyrene (e.g., poly($\alpha$-methylstyrene)), with an unsubstituted polystyrene being preferred.

It is also preferred that the pore-forming agent is bonded to a compound forming the film. By virtue of such a design, pores having a uniform size can be formed and reduction in the mechanical strength can be decreased.

The pore-forming agent may also be a granular substance having a size corresponding to the size of the pore produced in the insulating film. This substance is preferably a substance having an average diameter of 0.5 to 50 nm, more preferably from 0.5 to 20 nm. Such a substance is not limited in its construction material, and examples thereof include an ultra-branched polymer or latex type such as dendrimer. A crosslinked polystyrene-containing latex is particularly preferred.

Examples of such a substance include a polyamidamine (PAMAM) dendrimer available from Dendritech Inc. and described in Tomalia et al., Polymer J. (Tokyo), Vol. 17, 117 (0.1985); a polypropyleneimine-polyamine (DAB-Am) dendrimer available from DSM Corporation; a Frechet-type polyether dendrimer (described in Frechet et al., J. Am. Chem. Soc., Vol. 112, 7638 (1990), Vol. 113, 4252 (1991)); a Percec-type liquid crystal monodendrone, a dendronated polymer, and a self-aggregate polymer thereof (described in Percec et al., Nature, Vol. 391, 161 (1998), J. Am. Chem. Soc., Vol. 119, 1539 (1997)); and a Voltron H-series dendritic polyester (commercially available from Perstorp AB).

The suitable mass average molecular weight of the polymer as the pore-forming agent is preferably from 2,000 to 100,000, more preferably from 3,000 to 50,000, still more preferably from 5,000 to 20,000.

The amount of the pore-forming agent in the film-forming composition is preferably from 1 to 50 mass %, more preferably from 10 to 40 mass %, still more preferably from 20 to 30 mass %, based on the entire solid content.

The film-forming composition of the present invention preferably contains an adhesion accelerator.

Representative examples of the adhesion accelerator for use in the present invention include a silane, preferably an organosilane such as alkoxysilane (e.g., trimethoxyvinylsilane, triethoxyvinylsilane, tetraethoxy-silane, phenyltrimethoxysilane, allyltrimethoxysilane, divinyldiethoxysilane) and acetoxysilane (e.g., vinyl-triacetoxysilane, 3-aminopropyltrimethoxysilane), and a hydrolysate or dehydration condensate thereof; hexamethyl-disilazane [$(CH_3)_3$—Si—NH—Si$(CH_3)_3$]; an aminosilane coupler such as $\gamma$-aminopropyltriethoxysilane; and a chelate (for example, from the standpoint of forming aluminum oxide, aluminum monoethylacetoacetate diisopropylate [$(i-C_3H_7O)_2Al$ $(OCOC_2H_5CHCOCH_3)$)] and aluminum alkoxide). These materials may be mixed and used. Those commercially available as an adhesion accelerator may also be used.

The amount of the adhesion accelerator added in the film-forming composition is generally from 0.05 to 5 mass %, preferably from 0.1 to 2 mass %, based on the entire solid content.

An insulating film may be formed by coating the coating solution of the present invention on a substrate by an arbitrary method such as spin coating, roller coating, dip coating and scanning, and then removing the solvent by a heat treatment. The method for the heat treatment is not particularly limited, but a commonly employed method such as hot plate heating, furnace heating and light-irradiation heating using a xenon lamp by RTP (rapid thermal processor) or the like, may be applied.

The polymer of the present invention coated on a substrate is preferably cured by a heat treatment. For example, the polymer may be made insoluble and infusible by polymerizing the triple bond remaining therein at the post-heating. As for the conditions of the post-heat treatment, the heating temperature is preferably from 100 to 450° C., more preferably from 200 to 420° C., still more preferably from 350 to 400° C., and the heating time is preferably from 1 minute to 2 hours, more preferably from 10 minutes to 1.5 hours, still more preferably from 30 minutes to 1 hour.

The post-heat treatment may be performed in several parts. In particular, the post-heat treatment is preferably performed in a nitrogen atmosphere so as to prevent thermal oxidation by oxygen.

The film obtained by using the coating solution of the present invention can be used for various purposes. For example, the film is suitable as an insulating coat for electronic components such as semiconductor device and multi-chip module multilayer wiring board. Specifically, this film can be used as an interlayer insulating film for semiconductors, a surface protective film, a buffer coat film, a passivation film in LSI, an $\alpha$-ray blocking film, a coverlay film for flexographic plates, an overcoat film, a cover coat for flexible copper-lined plates, a solder-resist film, a liquid-crystal alignment film or the like.

As another usage, the film of the present invention may also be used as an electrically conducting film by doping an electron donor or acceptor to impart electrical conductivity.

EXAMPLES

The present invention is described below by referring to Examples, but the scope of the present invention is not limited thereto.

Example 1

3,3'-Diethynyl-1,1'-biadamantane (Compound D-2) was synthesized according to the method described in Journal of Polymer Science Part A: Polymer Chemistry, Vol. 30, 1747-1754 (1992). Subsequently, 10 g of 3,3'-diethynyl-1,1'-biadamantane, 50 ml of 1,3,5-triisopropylbenzene and 150 mg of Pd(PPh$_3$)$_4$ were stirred at an inner temperature of 200° C. for 10 hours in an nitrogen stream. The reaction solution was cooled to room temperature and after removing insoluble matters by filtration, 300 ml of isopropyl alcohol was added to the filtrate. The precipitated solid was collected by filtration and washed with isopropyl alcohol. In this way, 3.0 g of Polymer (A) having a mass average molecular weight of 200,000 was obtained. The solubility of Polymer (A) in cyclohexanone was 15 mass % or more at 25° C.

A coating solution was prepared by completely dissolving 1.0 g of Polymer (A) in 7.3 g of cyclohexanone at room temperature. The resulting solution was filtered through a 0.2-micron tetrafluoroethylene-made filter and spin-coated on a silicon wafer, and this coat was heated on a hot plate at 250° C. for 60 seconds in a nitrogen stream and then fired in a nitrogen-purged oven at 400° C. for 60 minutes, as a result, a uniform film having a thickness of 0.5 microns and free from particles was obtained. This film was dipped in cyclohexanone at room temperature for 5 hours, but the film pressure was not decreased at all. The relative dielectric constant of the film was calculated from the capacity value measured at 1 MHz by using a mercury probe manufactured by Four Dimension and an LCR meter HP4285A manufactured by Yokogawa Hewlett-Packard and found to be 2.46. The surface state after film coating was good. Incidentally, the temperature at the measurement of dielectric constant was 25° C. (hereinafter the same)<

Example 2

A coat was produced thoroughly in the same manner as in Example 1 except for changing the coating solvent to anisole. The dielectric constant was 2.46. Also, the surface state after film coating was good.

Example 3

In a nitrogen stream, 2 g of 3,3'-diethynyl-1,1'-biadamantane (Compound D-2), 0.4 g of dicumyl peroxide (PERCUMYL D, produced by NOF Corp.) and 10 ml of tert-butylbenzene were stirred at an inner temperature of 150° C. for 3 hours, thereby effecting polymerization. The reaction solution was cooled to room temperature and then added to 100 ml of methanol, and the precipitated solid was collected by filtration and washed with methanol. In this way, 1.5 g of Polymer (B) having a mass average molecular weight of about 12,000 was obtained.

FIG. 1 shows the $^1$H-NMR chart (400 MHz, solvent: CDCl$_3$) of Polymer (B)

A coating solution was prepared by completely dissolving 1.0 g of Polymer (B) in 10 g of cyclohexanone at room temperature. The resulting solution was filtered through a 0.1-micron tetrafluoroethylene-made filter and spin-coated on a silicon wafer, and this coat was heated on a hot plate at 150° C. for 60 seconds in a nitrogen stream.

Figure 2:
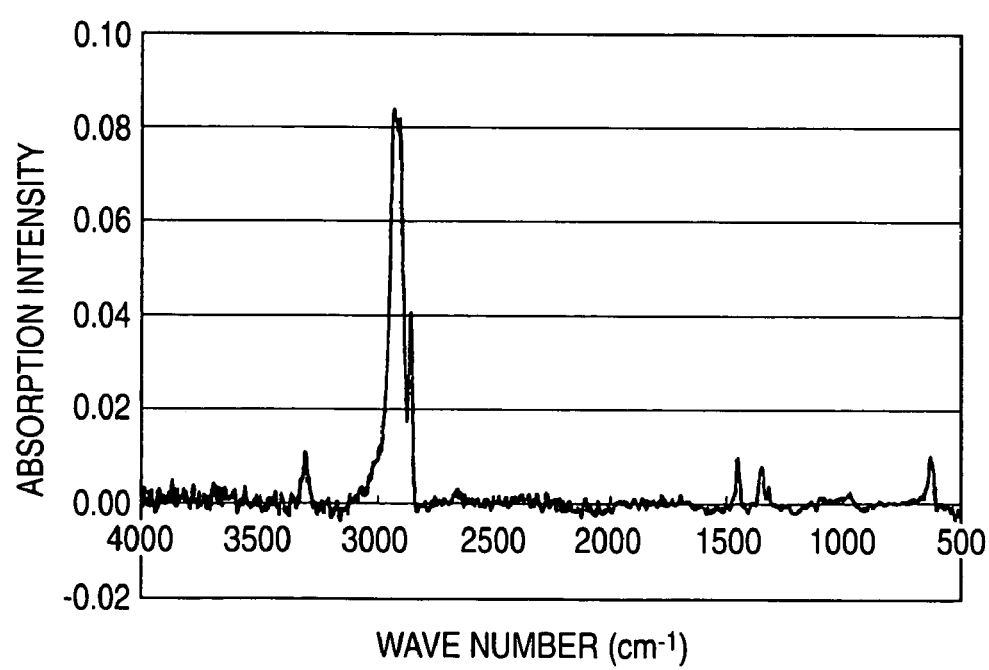
FIG. 2 is an FT-IR chart of the thin film formed from Polymer (B) in Example 3.

FIG. 2 shows the FT-IR chart of this thin film.

Thereafter, the coat was fired in a nitrogen-purged oven at 400° C. for 60 minutes, as a result, a uniform film having a thickness of 0.5 microns and free from particles was obtained.

Figure 3:
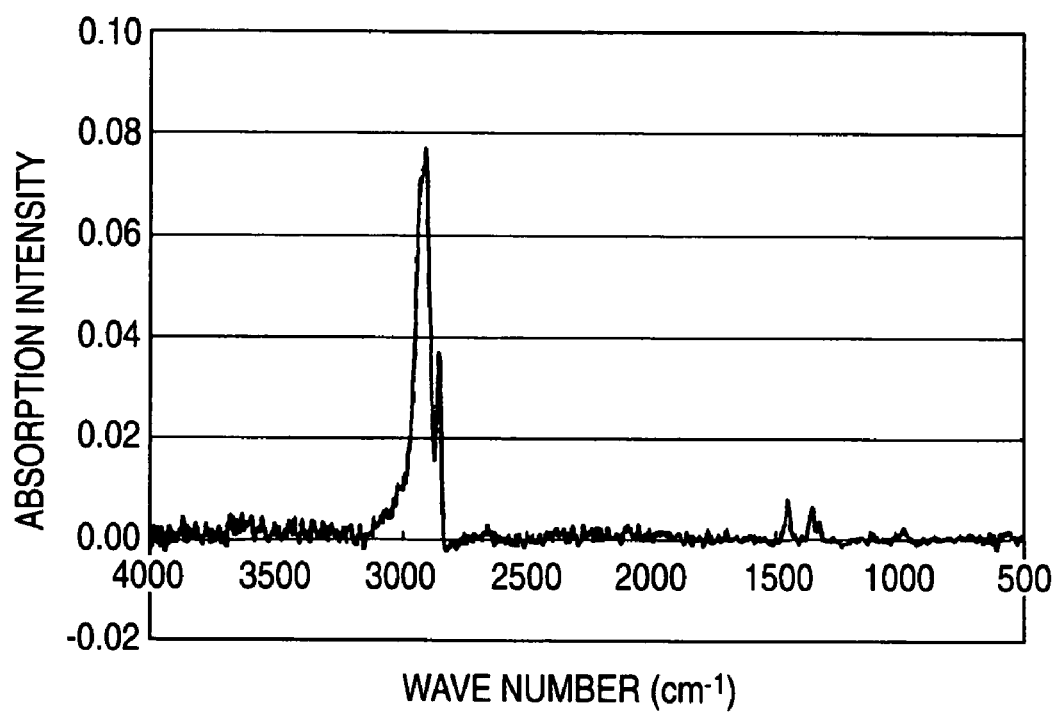
FIG. 3 is an FT-IR chart of the thin film after firing, formed from Polymer (B) in Example 3.

FIG. 3 shows the FT-IR chart of the thin film after curing.

This film was dipped in cyclohexanone at room temperature for 5 hours, but the film pressure was not decreased at all. The relative dielectric constant of the film was calculated from the capacity value measured at 1 MHz by using a mercury probe manufactured by Four Dimension and an LCR meter HP4285A manufactured by Yokogawa Hewlett-Packard and found to be 2.40. Also, the Young's modulus was measured by using Nano-Indenter SA2 manufactured by MTS (measurement temperature: 25° C.) and found to be 9.0 GPa. The surface state after film coating was good.

Example 4

In a nitrogen stream, 2 g of 3',3',3",3"-tetramethyl-3,3-diethynyl-1,1-biadamantane (Compound D-33), 0.4 g of dicumyl peroxide (PERCUMYL D, produced by NOF Corp.) and 10 ml of tert-butylbenzene were stirred at an inner temperature of 150° C. for 5 hours, thereby effecting polymerization. The reaction solution was cooled to room temperature and then added to 100 ml of methanol, and the precipitated solid was collected by filtration and washed with methanol. In this way, 1.4 g of Polymer (C) having a mass average molecular weight of about 15,000 was obtained. A coating solution was prepared by completely dissolving 1.0 g of Polymer (C) in 10 g of cyclohexanone at room temperature. The resulting solution was filtered through a 0.1-micron tetrafluoroethylene-made filter and spin-coated on a silicon wafer, and this coat was heated on a hot plate at 150° C. for 60 seconds in a nitrogen stream and further fired in a nitrogen-purged oven at 400° C. for 60 minutes, as a result, a uniform film having a thickness of 0.5 microns and free from particles was obtained. This film was dipped in cyclohexanone at room temperature for 5 hours, but the film pressure was not decreased at all. The relative dielectric constant of the film was calculated from the capacity value measured at 1 MHz by using a mercury probe manufactured by Four Dimension and an LCR meter HP4285A manufactured by Yokogawa Hewlett-Packard and found to be 2.38. The surface state after film coating was good.

Example 5

In a nitrogen stream, 10 g of 3,3,3'-triethynyl-1,1'-biadamantane (Compound D-3) synthesized, 50 ml of 1,3,5-triisopropylbenzene and 150 mg of Pd(PPh$_3$)$_4$ were stirred at an inner temperature of 200° C. for 10 hours. The reaction solution was cooled to room temperature and after removing insoluble matters by filtration, 300 ml of isopropyl alcohol was added to the filtrate. The precipitated solid was collected by filtration and washed with isopropyl alcohol. In this way, 3.0 g of Polymer (D) having a mass average molecular weight of 100,000 was obtained.

The solubility of Polymer (D) in cyclohexanone was 15 mass % or more at room temperature.

A coating solution was prepared by completely dissolving 1.0 g of Polymer (D) in 7.3 g of cyclohexanone at room temperature. The resulting solution was filtered through a 0.2-micron tetrafluoroethylene-made filter and spin-coated on a silicon wafer, and this coat was heated on a hot plate at 200° C. for 60 seconds in a nitrogen stream and further fired in a nitrogen-purged oven at 400° C. for 60 minutes, as a result, a uniform film having a thickness of 0.5 microns and free from particles was obtained. This film was dipped in cyclohexanone at room temperature for 5 hours, but the film pressure was not decreased at all. The relative dielectric constant of the film was calculated from the capacity value measured at 1 MHz by using a mercury probe manufactured by Four Dimension and an LCR meter HP4285A manufactured by Yokogawa Hewlett-Packard and found to be 2.47. The surface state after film coating was good.

Example 6

In a nitrogen stream, 5 g of 1-ethynylbiadamantane synthesized, 5 g of 3,3'-diethynyl-1,1'-biadamantane, 50 ml of 1,3,5-triisopropylbenzene and 150 mg of Pd(PPh$_3$)$_4$ were stirred at an inner temperature of 200° C. for 15 hours. The reaction solution was cooled to room temperature and after removing insoluble matters by filtration, 300 ml of isopropyl alcohol was added to the filtrate. The precipitated solid was collected by filtration and washed with isopropyl alcohol. In this way, 3.0 g of Polymer (E) having a mass average molecular weight of 100,000 was obtained. The solubility of Polymer (E) in cyclohexanone was 15 mass % or more at room temperature.

A coating solution was prepared by completely dissolving 1.0 g of Polymer (E) in 7.3 g of cyclohexanone at room temperature. The resulting solution was filtered through a 0.2-micron tetrafluoroethylene-made filter and spin-coated on a silicon wafer, and this coat was heated on a hot plate at 150° C. for 60 seconds in a nitrogen stream and further fired in a nitrogen-purged oven at 400° C. for 60 minutes, as a result, a uniform film having a thickness of 0.5 microns and free from particles was obtained. This film was dipped in cyclohexanone at room temperature for 5 hours, but the film pressure was not decreased at all. The relative dielectric constant of the film was calculated from the capacity value measured at 1 MHz by using a mercury probe manufactured by Four Dimension and an LCR meter HP4285A manufactured by Yokogawa Hewlett-Packard and found to be 2.45. The surface state after film coating was good.

Example 7

A cyclohexanone coating solution (8.3 g) of Polymer (A) was prepared in the same manner as in Example 1. Subsequently, 0.2 g of polystyrene having a mass average molecular weight of 13,700 was added as a pore-forming agent to the solution prepared above and completely dissolved. By using this coating solution, a coat was produced in the same manner as in Example 1. The relative dielectric constant of the film was 2.27. Also, the surface state after film coating was good.

A coating solution (8.5 g) containing a pore-forming agent was produced in the same manner as in Example 5. Separately, a 3-fold molar amount of water was added to vinyltriacetoxysilane and through stirring at room temperature for 10 minutes, hydrolysis and dehydrating condensation were effected to synthesize a partial condensation product as an adhesion accelerator. Subsequently, 10 ml of this condensation product was added to the coating solution and completely dissolved. By using the thus-obtained coating solution, a coat was produced in the same manner as in Example 1. The relative dielectric constant was 2.27. Also, the surface state after film coating was good.

Comparative Example 1

1,3,5-Triethynyladamantane (1 g) was dissolved in 10 g of anisole and without using a catalyst, the resulting solution was stirred at an inner temperature of 200° C. for 50 hours. By the GPC measurement, it was found that 97% of the reaction solution was occupied by the raw material 1,3,5-triethynyladamantane.

A coat was produced in the same manner as in Example 1 by using the obtained compound, but a uniform insulating film could not be formed.

Comparative Example 2

1,3-Diethynyladamantane (5 g) was reacted in triisopropylbenzene at 210° C. for 100 hours without using a catalyst, and a post-treatment was performed according to the method of Example 1, as a result, 1.0 g of Polymer (F) was obtained. A coating solution was prepared by completely dissolving 1.0 g of Polymer (F) in 7.3 g of cyclohexanone, and a coat was produced in the same manner as in Example 1. The dielectric constant of the film was measured and found to be 2.63. The surface state after film coating was bad.

It is seen that in Examples using the film-forming composition of the present invention, the dielectric constant and the surface state are excellent as compared with Comparative Examples.

The polymer of the present invention has a sufficiently high solubility in a coating solvent such as cyclohexanone widely used in the field of production of an electronic device, the film-forming composition using the polymer is uniform without precipitation of an insoluble matter, and the insulating film formed from the composition has a low relative dielectric constant and a good surface state and is usable as an interlayer insulating film in an electronic device or the like.

The entire disclosure of each and every foreign patent application from which the benefit of foreign priority has been claimed in the present application is incorporated herein by reference, as if fully set forth.

What is claimed is:

1. A polymer obtained by polymerizing a compound represented by formula (I) in a presence of a radical polymerization initiator:

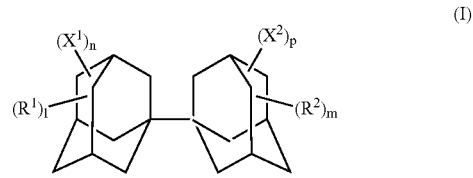

wherein R$^1$ and R$^2$ each independently represents a substituent containing a carbon-carbon triple bond;

X$^1$ and X$^2$ each independently represents a substituent except for a substituent containing a carbon-carbon triple bond;

l and m each independently represents an integer of 0 to 15, provided that l and m are not 0 at the same time;

p and n each independently represents an integer of 0 to 14; and the polymer can be dissolved in cyclohexanone to a concentration of 1 mass % or more at 25° C.

2. The polymer according to claim 1,
wherein the radical polymerization initiator is selected from the group consisting of an organic peroxide and an azo compound.

3. The polymer according to claim 1,
wherein an amount of the radical polymerization initiator utilized is from 0.001 to 2 mol per mol of a monomer of the compound represented by formula (I).

4. A film-forming composition comprising a polymer according to claim 1.

5. A process for producing a polymer, the process comprising:
polymerizing a compound represented by formula (I) in a presence of a radical polymerization initiator:

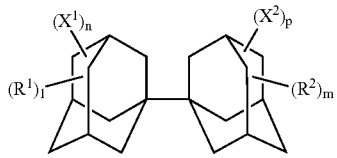

(I)

wherein R¹ and R² each independently represents a substituent containing a carbon-carbon triple bond;

X¹ and X² each independently represents a substituent except for a substituent containing a carbon-carbon triple bond;

l and m each independently represents an integer of 0 to 15, provided that l and m are not 0 at the same time;

p and n each independently represents an integer of 0 to 14; and the polymer can be dissolved in cyclohexanone to a concentration of 1 mass % or more at 25° C.

6. The process for producing a polymer according to claim 5, wherein the radical polymerization initiator is selected from the group consisting of an organic peroxide and an azo compound.

* * * * *